United States Patent
Prutchi et al.

(10) Patent No.: US 6,335,538 B1
(45) Date of Patent: Jan. 1, 2002

(54) ELECTRO-OPTICALLY DRIVEN SOLID STATE RELAY SYSTEM

(75) Inventors: David Prutchi, Lake Jackson; Michael Norris, Pearland, both of TX (US)

(73) Assignee: Impulse Dynamics N.V., Tirat Hacarmel (IL)

( * ) Notice: Subject to any disclaimer, the term of this patent is extended or adjusted under 35 U.S.C. 154(b) by 0 days.

(21) Appl. No.: 09/359,684

(22) Filed: Jul. 23, 1999

(51) Int. Cl.[7] .......................... G02B 27/00; H03K 3/42
(52) U.S. Cl. ........................... 250/551; 327/514
(58) Field of Search ............................. 250/551, 552, 250/229, 214 R, 214 LS, 214 SW; 327/434, 514; 607/5, 6, 7

(56) References Cited

U.S. PATENT DOCUMENTS 5,329,210 A * 7/1994 Peterson et al. ............ 250/551
5,360,979 A * 11/1994 Joseph et al. ............... 250/551

* cited by examiner

Primary Examiner—John R. Lee
Assistant Examiner—Kevin Pyo
(74) Attorney, Agent, or Firm—Rosenberg, Klein & Lee

(57) ABSTRACT

There is provided an electro-optically driven relay system (10) for switching the application of energy to a load (5). The subject relay system (10) comprises: a switch unit (100) operable responsive to a control signal; an electro-optic current generating unit (200) connected to the switch unit (100) for generating the necessary control signal responsive to an actuation signal; and, primary and supplemental drive units (300, 400) connected to the electro-optic current generating unit (200) for collectively generating the actuation signal. The primary drive unit (300) is operable responsive to a first input signal; and, the supplemental drive unit (400) is operable responsive to a second input signal to augment the actuation signal for at least a predetermined time duration. The switching response of the switch unit (100) is thereby accelerated.

27 Claims, 10 Drawing Sheets

ELECTRO-OPTICALLY DRIVEN SOLID STATE RELAY SYSTEM

BACKGROUND OF THE INVENTION

1. Field of the Invention

The subject relay system is generally directed to a system for selectively coupling an energy source to an electrical load. More specifically, the subject relay system is directed to an electro-optically driven solid state relay system having a sufficiently accelerated switching response time to be adaptable for use in many systems wherein reliability and safety concerns are paramount.

One of numerous examples of such systems is found in a defibrillation or other medical electronic support system serving to restore or maintain a patient's vital physiological functions. A defibrillation system is one that operates to apply a sharp, high-voltage pulse to one or more chambers of the patient's heart when fibrillation (rapid, irregular, and disorganized contraction of cardiac muscle) occurs. A defibrillation system thus serves to 'shock' an ailing heart back into a rhythmic beating action, thereby restoring the synchronism necessary for it to serve its proper function.

If not sufficiently remedied in this manner, fibrillation very immediately threatens grave consequences to the patient's well-being. It is imperative, therefore, that a defibrillation or other electronic system employed in such critical applications be particularly reliable in its operation. An individual's very life may be hanging on the balance.

The switching function intrinsic to the proper operation of many electronic systems, generally, is especially important in applications such as a defibrillation system, wherein the timing of the signals that the system generates and/or applies remains so critical. This criticality results not only from the synchronizing function that the system serves, but also from the fact that the system's vulnerability to potentially corrupting factors is often heightened during switching transient periods. Hence, it is essential for reliable and safe operation of many electronic systems— not only that the switching of its operation occur promptly at the required points in time—but that the switching occur as quickly as possible. This would, among other things, minimize the device's period of heightened vulnerability to failure.

An exemplary defibrillation system typically employs an H-bridge switching matrix to control the preparation and delivery of a prestored high voltage defibrillation pulse. The H-bridge includes a plurality of solid state switching devices, (typically four) that collectively provide the necessary switching actions. In many defibrillation system types, the solid state switching device is realized in the form of an insulated gate bipolar transistor (IGBT) for numerous reasons well recognized in the art.

To preserve reliability, measures are normally taken to electrically isolate the control terminals of switching devices from the actuating circuitry that generates the necessary control signals therefor. In certain applications, each solid state switching device is accordingly controlled by a signal prompted by the actuation circuitry through an electro-optical coupling. Devices such as photovoltaic isolators are employed in those cases, with the actuation circuitry driving one or more light emitting diodes in such manner that they optically excite one or more photovoltaic cells situated across an isolation gap from them. The photovoltaic cells responsively generate a control current that then charges the control terminal of the given switching device.

A number of practical problems are encountered when controlling the switching device in this manner. Perhaps the most prevalent of these problems is the insufficient rate at which the switching device's control terminal is charged. With an IGBT or comparable device, for instance, the device capacitance seen at the control terminal, or gate, imposes a non-trivial charge time delay before the device assumes its fully saturated state; that is, where its emitter-collector conduction path approaches a short circuit condition. While sustained application of a constant current signal to the optically-exciting light emitting diodes of the photovoltaic isolator eventually yields sufficient charging of the switching device gate, the time delay incurred invariably results in a correspondingly delayed switching response. A practical implication of such delayed switching response is a prolonged period during which heightened levels of energy dissipation occur in the switching device. This requires of the device greater built-in tolerance measures—measures which the implantability and/or other constraints pertaining to system applications such as defibrillators simply do not afford.

It is, therefore, particularly important in many applications that the period over which the device remains in the transitory state (between its 'open' and 'closed' circuit conditions) be minimized. During the transitory period, devices such as IGBTs operate within a characteristic active, or linear, region, wherein the device functions much like a resistor, dissipating substantial energy across its conduction terminals. Consequently, the device undergoes significant heating while it remains within this active region of operation. Permitting the device to remain in this region of operation over a prolonged duration permits a progressive accumulation of heat which heightens the risk of device failure, absent adequate means for dissipating the heat. Especially in implantable systems, highly restrictive size and weight constraints pose significant obstacles to providing adequate heat sinking capability in the device.

Optically-driven systems known in the art fail to provide a sufficient driving signal(s) to optimally minimize the transitory period for a given switching device operating under a given set of requirements. In a typical prior art optically-driven system for driving an IGBT switching device within a defibrillation system H-bridge, for example, full transition of the switching device occurs over no less than approximately 96 microseconds. The device undergoes progressive heating over much of that time; and, without measures in place specifically to curtail the period of heating, the device is exposed to a higher risk of failure than it needs to be.

In applications such as implantable defibrillators and other devices, another point of concern is the source by which a relay system switching device is driven. It is important to separately generate the energy necessary to drive the given switching device, apart from the generation of the actual energy to be delivered to the load in question. It is preferable that self-energizing control measures be employed accordingly to drive the switching device.

There is, therefore, a need for a relay system adapted to drive a load in highly responsive, yet highly reliable, manner. There is a need to realize such a system wherein adequate electrical isolation between at least a substantial portion of the given actuation circuitry and the given switching device(s) is effectively maintained, and wherein superfluous dissipation of energy is minimized.

2. Prior Art

Electro-optically driven relay systems for electrically driving a load are known in the art, as are such systems that employ photovoltaic isolator devices. The best prior art known to Applicant includes: U.S. Pat. Nos. 5,061,859; 5,329,210; 4,295,226; 5,132,553; 5,013,926; 4,902,901; 5,105,090; 4,777,387; 5,693,952; 4,723,312; 4,227,098; and, 4,390,790. The known systems disclosed in such prior art, however, fail to provide for the energization of one or more driver switching devices in the manner provided for by the subject driver system. They fail to provide the electro-optically coupled energization of a switching device with the degree of reliability attained by the subject relay system (for a given set of operational requirements).

For instance, U.S. Pat. No. 5,061,859 is directed to an optical isolator wherein a light emitting device (LED) is actuated to excite a photodiode that is connected to switching circuitry. The turn-on and turn-off speed of the LED is enhanced by control circuitry connected thereto which instantaneously augments the current flow at the rising and falling edges of an LED input signal. Prior to receiving this input signal, the LED is pre-biased by separate circuitry such that its capacitance is charged to a level just below that necessary to prompt its emission of light.

Unlike the subject relay system, however, the current augmentation in this prior art system is provided only instantaneously, and exclusively at only the rising and falling edges of the LED input signal. The momentary augmentation is generated by a pulse capacitor in the control circuitry and, therefore, is necessarily time-aligned with each input signal rising and falling edge. The augmentation pulse is not and cannot be applied substantially over a predetermined duration. Nor can the augmentation pulse be offset in time relative to the rising and falling edges of the LED input signal.

One implication of this is that the sum quantity of augmentation energy delivered to the LED within one LED input signal period is necessarily limited to a restrictive level. Indeed, compensatory measures in the form of the pre-bias circuitry attest to this fact. Another implication is that the quantity of energy yielded by the electro-optic coupling of the LED and photodiode may not be sufficient to actually energize a main switching device. The need to so energize a main switching device is altogether obviated in the disclosed system, for the signal derived via the electro-optic coupling is merely current flow through the photodiode that then initiates the operation of a pair of active amplifier circuits. It is the operation of these active circuits which ultimately energizes a voltage comparator that serves the main switching function.

This voltage comparator switching device is energized only upon prior operation of the active amplifier circuits connected thereto. The switching device cannot be energized directly by the electro-optically generated current signal.

SUMMARY OF THE INVENTION

It is therefore a primary object of the present invention to provide an electro-optically driven relay system that provides highly responsive and highly reliable operation.

It is another object of the present invention to provide an electro-optically driven relay system wherein the switching response of a switch unit is accelerated by augmenting an actuation signal over a predetermined duration.

It is yet another object of the present invention to provide an electro-optically driven relay system wherein a switch unit for selectively controlling energization of a load is rapidly energized for operation using an electro-optic current generating unit.

These and other objects are attained in an electro-optically driven relay system formed in accordance with the present invention. The subject relay system comprises: a switch unit for selectively controlling energization of a load responsive to a control signal; an electro-optic current generating unit connected to the switch unit for generating the necessary control signal responsive to an actuation signal; and, primary and supplemental drive units connected to the electro-optic current generating unit for collectively generating the actuation signal. The primary drive unit is operable responsive to a first input signal. The supplemental drive unit is operable responsive to a second input signal to augment the actuation signal for at least a predetermined non-zero duration. The switching response of the switch unit is thereby accelerated.

In one embodiment of the subject relay system, at least one supplemental drive unit is connected in a circuit path parallel to that in which the primary drive unit is connected, and the electro-optic current generating unit includes at least one photovoltaic isolator device. The supplemental drive unit in that embodiment is operable to augment the actuation signal by maintaining at least a predetermined current amplitude over at least the predetermined non-zero duration. Both the primary and supplemental drive units in that embodiment include a field effect transistor device, with the switch unit including at least one insulated gate bipolar transistor.

DESCRIPTION OF THE PREFERRED EMBODIMENTS

Figure 1:
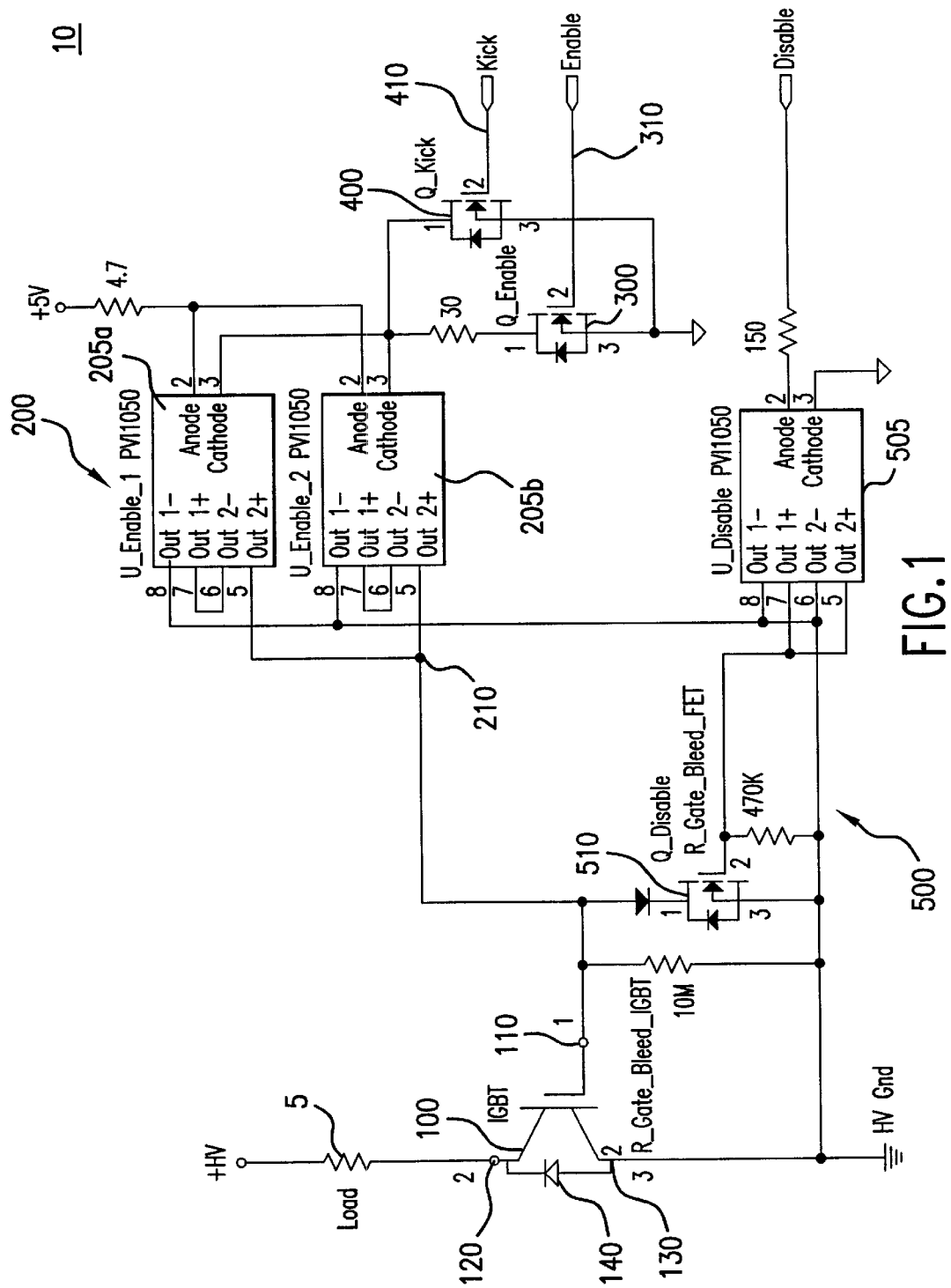
FIG. 1 is a schematic diagram illustrating one embodiment of the present invention.

Turning now to FIG. 1, there is shown a schematic diagram of one embodiment of the subject electro-optically driven relay system 10 coupled to a load 5. Relay system 10 generally includes a switch unit 100; an electro-optic current generating unit 200 having an output terminal connected to switch unit 100; a primary drive unit 300 connected to electro-optic current generating unit 200; and, at least one supplemental drive unit 400 also connected to electro-optic current generating unit 200. Relay system 10 in this embodiment further includes a supplemental disabling unit 500 which serves to accelerate the deactivating transition of switch unit 200, but which is not essential to the present invention.

Switch unit 100 is connected as shown with its conduction path defined across its terminals 120, 130 connected in series with the given load 5. Its control terminal 110 is connected as shown to a node 210 that, in turn, is connected to the output of electro-optic current generating unit 200. When a control signal is sufficiently established at node 210, switch unit 100 is energized via its control terminal 110 to turn-on the conduction path across terminals 120, 130. Unit 100 includes a protection diode 140 coupled across the conduction path to protect against reverse current flow therethrough.

Switch unit 100 may be realized by one or a combination of any suitable switching devices known in the art. It may, for instance, include one or more solid state switching devices known in the art whose characteristic parameters are adaptable to the intended application. In the embodiment shown, the intended application is within a defibrillation system, with a plurality of switch units 100 (hence, a plurality of relay systems 10) coupled together for operation within an H-bridge switch matrix, if so desired. It is to be understood that a defibrillation system forms but one exemplary application of relay system 10; and, relay system 10 may find application in various other types of systems.

For the defibrillation system application shown, an insulated gate bipolar transistor (IGBT) is well-suited for switching the application of the required high voltage signal through the load 5. A notable consideration is the ease of voltage control and the characteristically low level of losses at high operating voltages that use of an IGBT device affords. Those skilled in the art will readily recognize that the characteristic properties of IGBTs are comparable to those of certain field effect transistor types, but with the additional benefit generally attributable to bipolar junction transistors of a substantially lower effective ON resistance.

Accordingly, switch unit 100 in the embodiment shown employs a suitable IGBT device known in the art. One such IGBT device is the IXGH17N100U1 made commercially available by IXYS Corporation of Santa Clara, Calif. The IXGH17N100U1 device incorporates second generation HDMOS technology to yield a collector-to-emitter voltage at device saturation of 3.5V. This advantageously results in minimal ON-state conduction losses.

Electro-optic current generating unit 200 operates generally to derive a control signal of sufficient energy to rapidly charge the device capacitance seen at gate terminal 110 of IGBT 100 and place the device in its saturated, or conductive ON state. With the aid of primary and supplemental drive units 300, 400 in accordance with the present invention, electro-optic current generating unit 200 delivers a sufficient amount of electrical charge to gate terminal 110 of IGBT 100 to so energize and activate switch unit 100. Electro-optic current generating unit 200 preferably includes at least one photovoltaic isolator of any type known in the art suitable for the specific requirements of the intended application. In the embodiment shown, a pair of photovoltaic isolator devices is utilized, coupled in parallel such that the output current derived by each may combine at node 210 for application to gate terminal 110.

A photovoltaic isolator device such as the PVI1050 integrated circuit chip made commercially available by International Rectifier Corporation of El Segundo, Calif. may be employed. As indicated in FIG. 1, each PVI1050 device utilizes at its input a light emitting diode whose anode terminal is coupled through a resistive device to an external supply voltage and whose cathode terminal is connected to primary and supplemental drive units 300, 400. The device's light emitting diode, when energized, generates light emission that, in turn, energizes by photovoltaic action a plurality of photosensors situated at the electrically isolated device output.

Figure 1A:
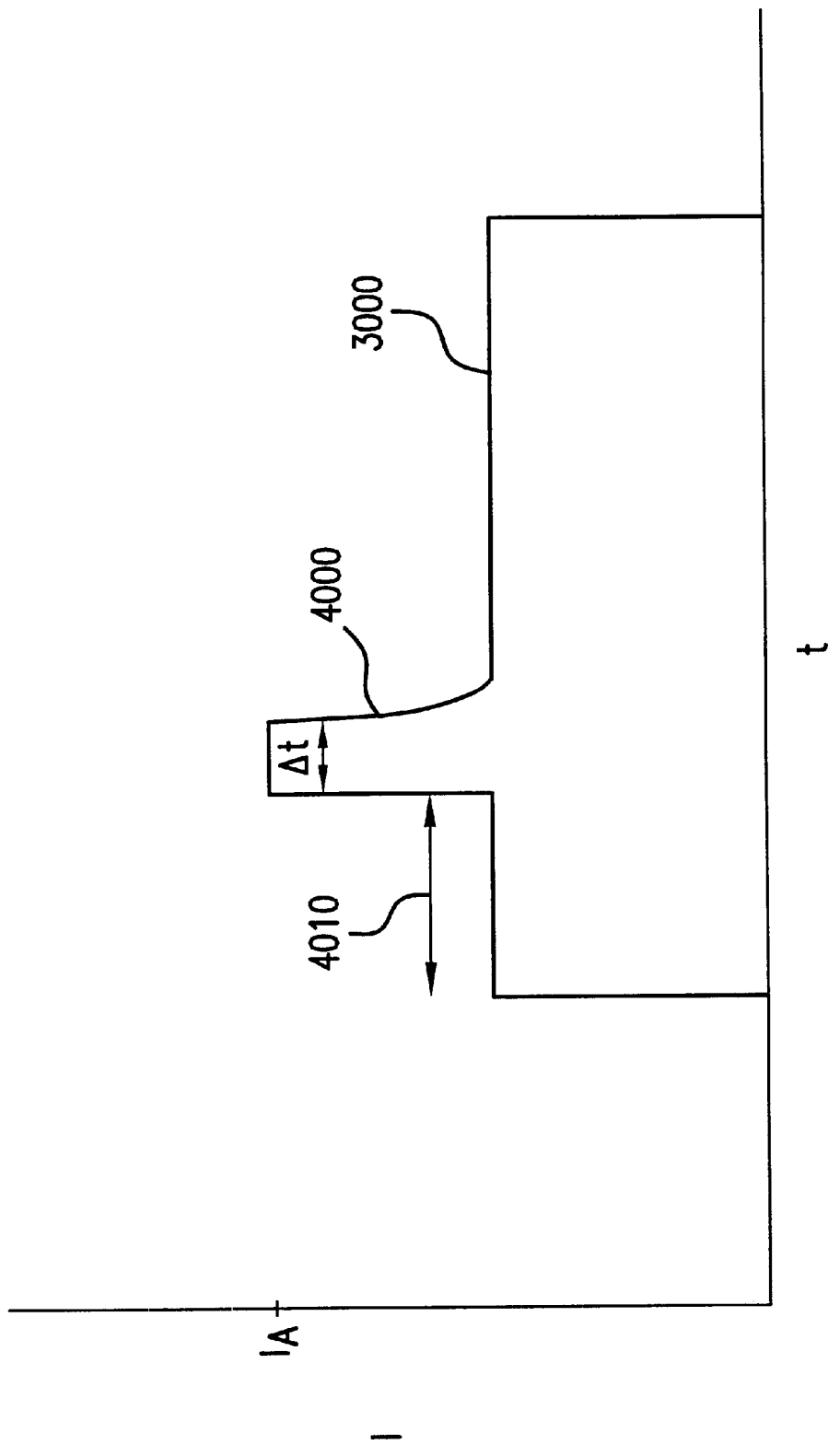
FIG. 1A is a graphic characterization of an actuation signal generated in accordance with one embodiment of the present invention.

An exemplary actuation signal energizing the light emitting diode of each photovoltaic isolator 205a, 205b, is graphically illustrated in FIG. 1A. It is to be understood that the graphic diagram shown is intended for illustrative purposes only. As such, it constitutes a greatly simplified characterizing diagram presented without any attention to proper scaling.

The actuation signal includes a base component 3000 selectively generated responsive to the activation of primary drive unit 300 and a supplemental component 4000 selectively generated responsive to the activation of supplemental drive unit 400. The supplemental component 4000 augments the current amplitude of the base component 3000 over at least a predetermined time duration $\Delta t$. For the application shown, the supplemental component 4000 may augment the current amplitude of the base component 3000 over a period, $\Delta t$, of approximately 100 microseconds to maintain the current amplitude through each light emitting diode during that period at a predetermined current amplitude $I_A$ on the order of, for example, 300 mA. Of course, the duration $\Delta t$ and current amplitude $I_A$ may be predetermined to any other suitable values, depending on the requirements of the given application. Moreover, the actuation signal augmentation provided by the supplemental component 4000 may be applied in accordance with the present invention at any optimal time during which the base component 3000 is being generated. That is, the occurrence of the supplemental component pulse 4000 may be offset in time relative to the leading edge of the base component pulse 3000, as indicated by the bidirectional arrow 4010.

Such control over relative signal component timing and, indeed, over relative signal component widths may be effected by any suitable means known in the art. For example, the system controller (not shown) may be appropriately programmed to suitably provide the necessary control. Alternatively, various passive devices suitably characterized by the necessary parameter values may be incorporated into the circuitry to introduce desired signal transition delays.

Primary drive unit 300 preferably includes at least one solid state switching device, such as a suitable MOSFET or other transistor device known in the art. Its control terminal 310 is coupled to external circuitry in such manner that it receives a controlling input signal from a system controller (not shown). In the application shown, primary drive unit 300 receives an 'Enable' signal from the defibrillation system controller at those times when a high voltage signal is to be delivered to load 5.

Obviously, where the controlling input signal delivered by the system controller is, itself, constructed of a suitable waveform configuration to drive the LED(s) of current generating unit 200, primary drive unit 300 may be realized, effectively, by the system controller. Primary drive unit 300, in any case, drives the LED(s) at a drive current level residing safely within the DC current range that the device (s) is designed to withstand.

Driving the given LED(s) at even the maximum DC current limit, however, may not yield sufficiently quick charging of the IGBT control terminal 110 to optimally minimize energy dissipation at IGBT 100. Given that LED devices are generally capable of tolerating significantly higher levels of current when pulsed for approximately 100 $\mu$s—typically, as much as approximately 8 to 10 times the DC current level generated by primary drive unit 300—a supplemental current may be temporarily applied without harming the LED(s). In accordance with the present invention, this is done so as to augment for a predetermined time duration the current generated by primary drive unit 300, and thereby accelerate the switching of IGBT 100. Supplemental drive unit 400 effectively serves this function.

Supplemental drive unit 400 also includes at least one solid state switching device of suitable type known in the art, such as a MOSFET or other transistor device. Supplemental drive unit 400 is preferably disposed within a circuit branch connected in parallel to that within which primary drive unit 300 is disposed. Its control terminal 410 is preferably also coupled to a controller to receive therefrom a controlling 'Kick' input signal, in response to which supplemental drive unit 400 begins and sustains conduction over the appropriate augmentation period Δt.

Supplemental disabling unit 500 is provided to aid in the turn-off transition of IGBT 100. While included in the embodiment shown, supplemental disabling unit 500 is not essential to the present invention. In any event, it employs a photovoltaic isolator 505 that, responsive to a 'Disable' signal from a controller device, activates a transistor 510 whose conduction path effectively ties gate terminal 110 of IGBT 100 to the high voltage ground. This consequently turns OFF IGBT 100.

Figure 2:
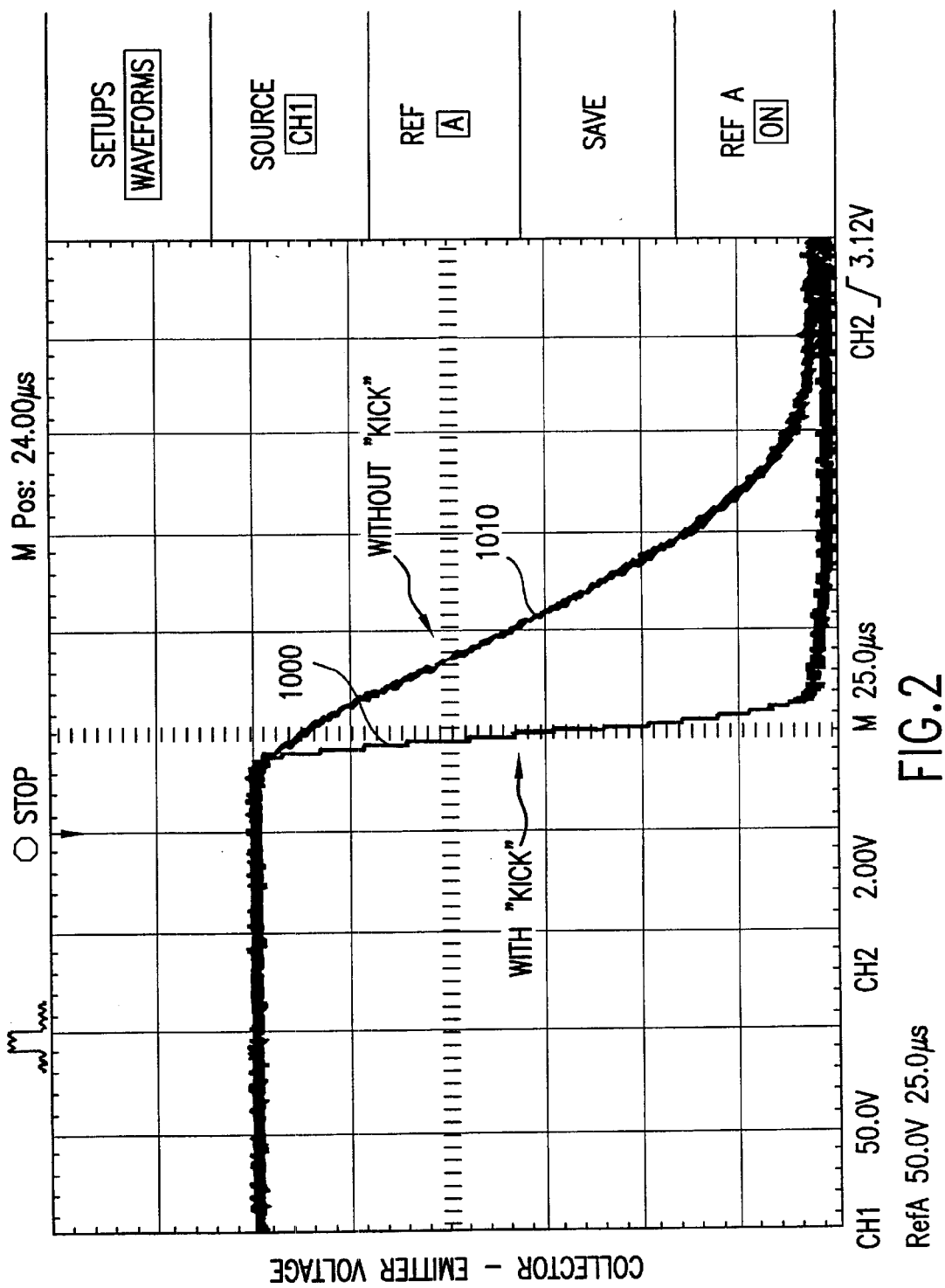
FIG. 2 is a graphic illustration of the signal response at one portion of the embodiment of the present invention of FIG. 1, shown in comparison to a corresponding signal response in a prior art relay system.

Referring now to FIG. 2, there is shown a graphic representation of a voltage potential difference profile 1000 measured across conduction terminals 120 and 130 of IGBT 100, when relay system 10 is operated in accordance with the present invention. Profile 1000 is shown, for comparison purposes, along with a reference profile 1010 indicating the potential difference measured across the same terminals 120 and 130 of IGBT 100, when relay system 10 is operated without the generation of a supplemental component pulse 4000 (FIG. 1A) to augment the base component 3000 of the actuation signal that drives current generating unit 200. The two profiles 1000, 1010 were, of course, generated under the same exemplary set of operating conditions.

Figure 3:
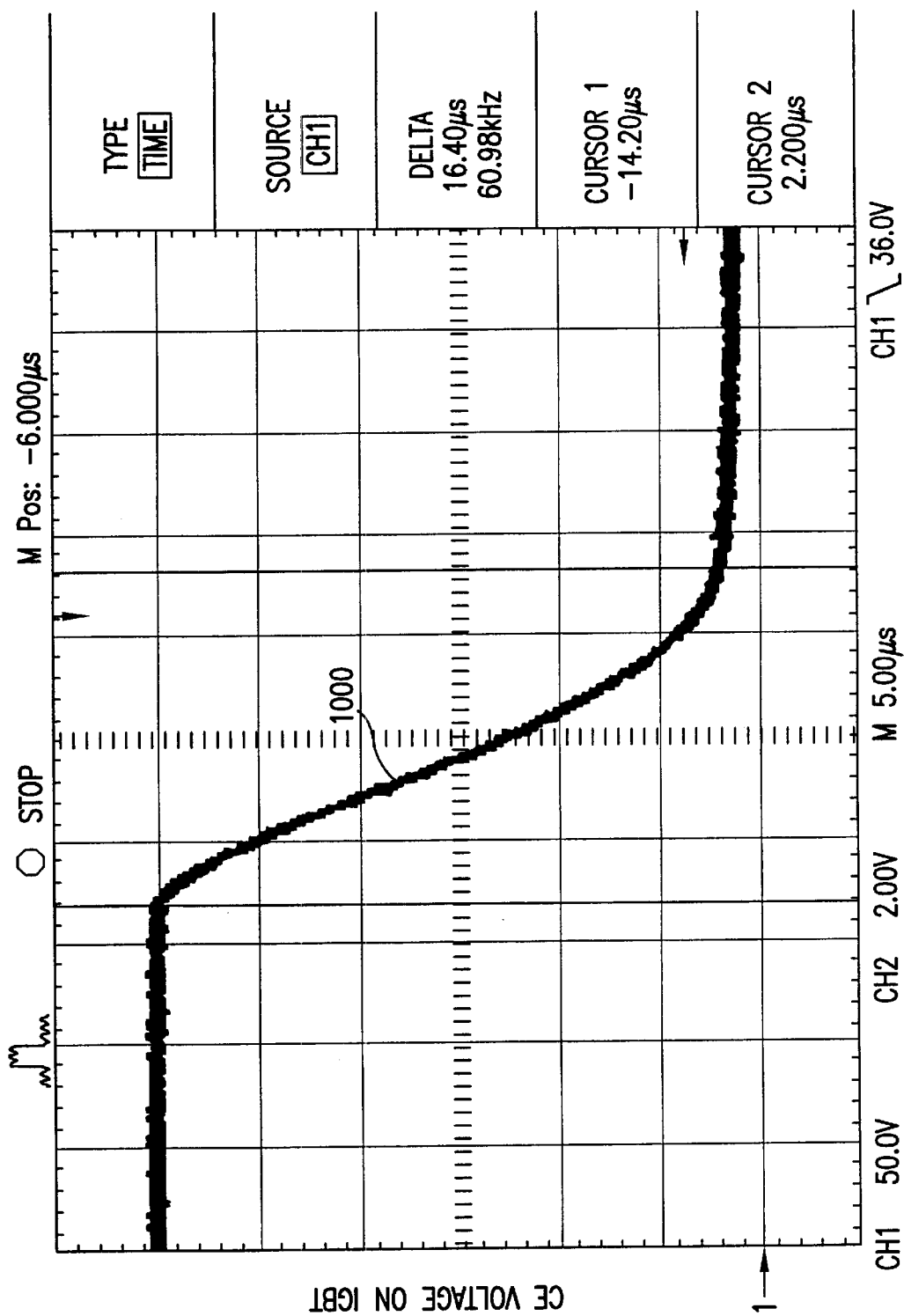
FIG. 3 is an isolated first portion of the graphic illustration of FIG. 2, shown in greater detail.
Figure 4:
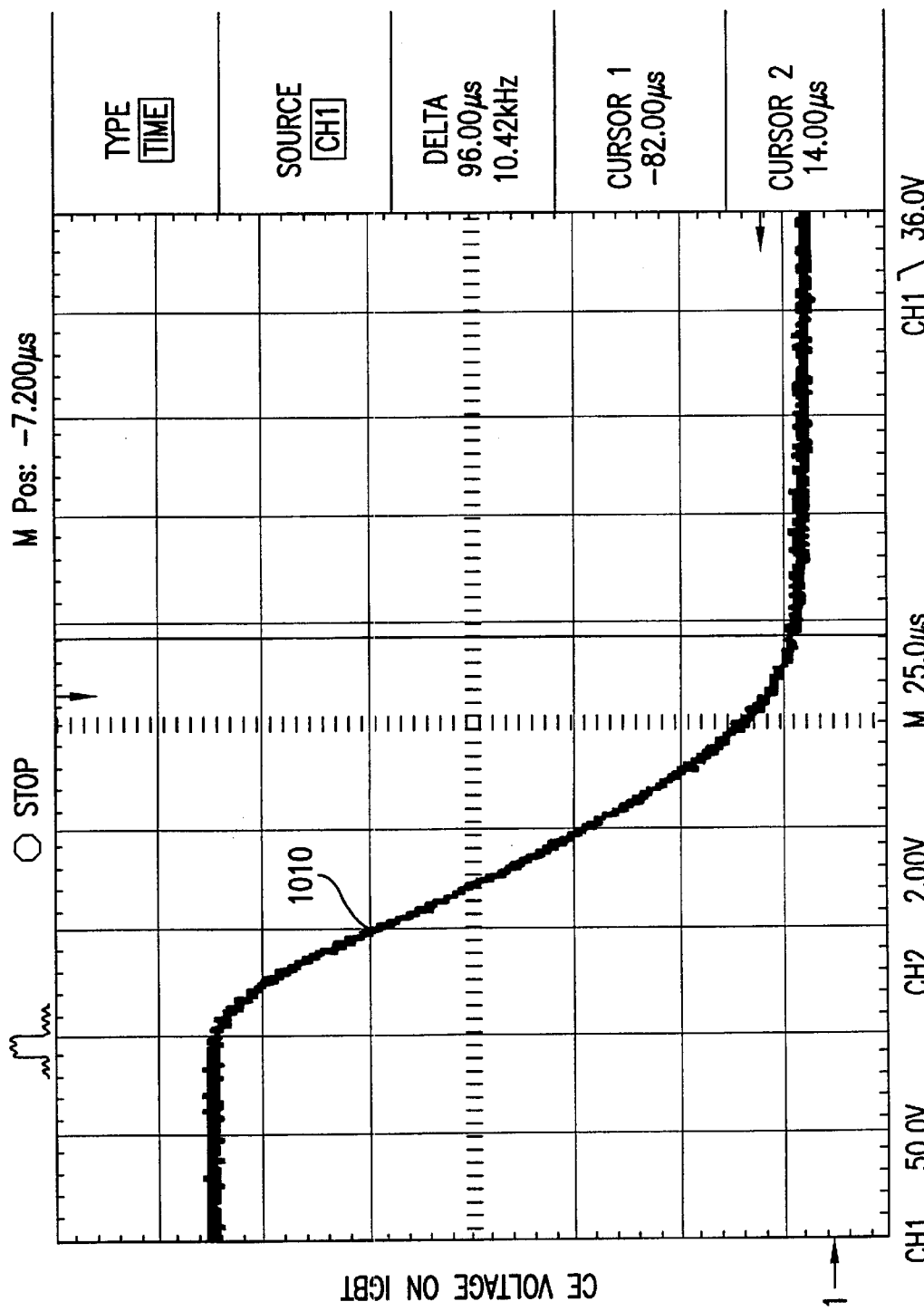
FIG. 4 is an isolated second portion of the graphic illustration of FIG. 2, shown in greater detail.

FIGS. 3 and 4 respectively show each of the profiles 1000, 1010 in isolation, and in greater detail. As illustrated, the voltage across terminals 120, 130 of IGBT 100 drops from a substantial DC device OFF-state voltage to a near-zero DC device ON-state voltage in less than 25 microseconds. The same voltage in profile 1010 drops to the lower device ON state voltage in no less than approximately 96 microseconds. With the actuation signal augmentation provided in accordance with the present invention in relay system 10, then, IGBT 100 is driven to switch between its OFF and ON conduction states in approximately one-quarter of the time than it would otherwise take.

Figure 5:
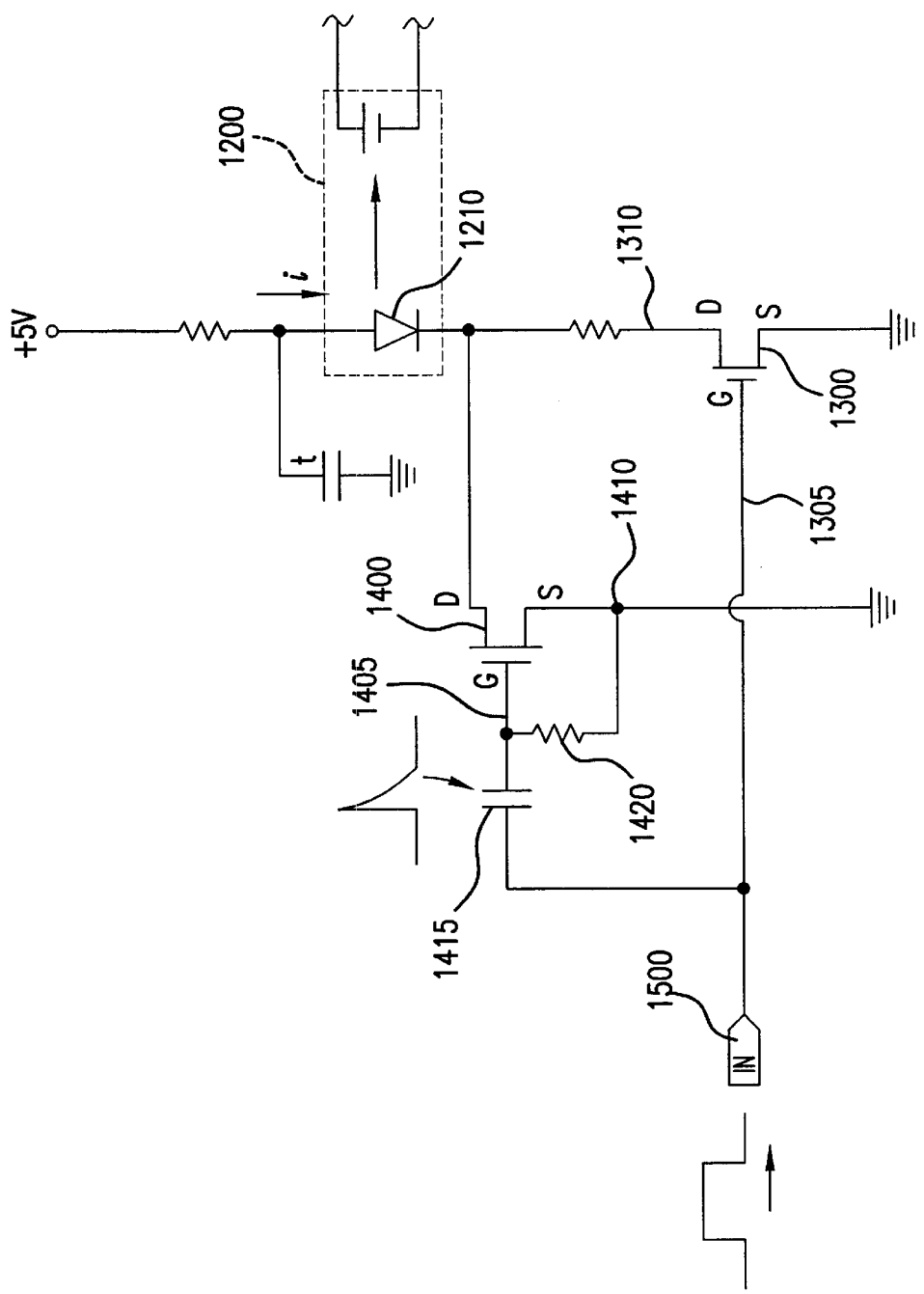
FIG. 5 is a schematic diagram of an alternate embodiment of a portion of the present invention; and, FIG. 6 is a schematic diagram of one exemplary application of the present invention.

Turning next to FIG. 5, there is shown an alternate embodiment of a portion of relay system 10. In that embodiment, the gate terminal 1305 of primary drive unit 1300 is driven by an input signal at input node 1500. Gate terminal 1405 of supplemental drive unit 1400 is driven responsive to this same input signal at node 1500 through a capacitor 1415. The gate and source terminals 1405, 1410 are connected by a resistance 1420 such that when the rising edge of an input signal applied at capacitor 1415 causes an instantaneous increase in current gate terminal 1405, supplemental drive unit 1400 begins and sustains the conduction until capacitor 1415 becomes fully charged. During this time, current amplitude augmentation occurs in the actuation current that is generated through light emitting diode 1210 of photovoltaic isolator 1200. The period over which augmentation occurs may be conveniently controlled by selecting accordingly the values for capacitance 1415 and resistance 1420. Note that this embodiment necessarily restricts the rising edges of the actuation signal's base and supplemental components 3000, 4000 (FIG. 1A) to substantial alignment in time.

Figure 6:
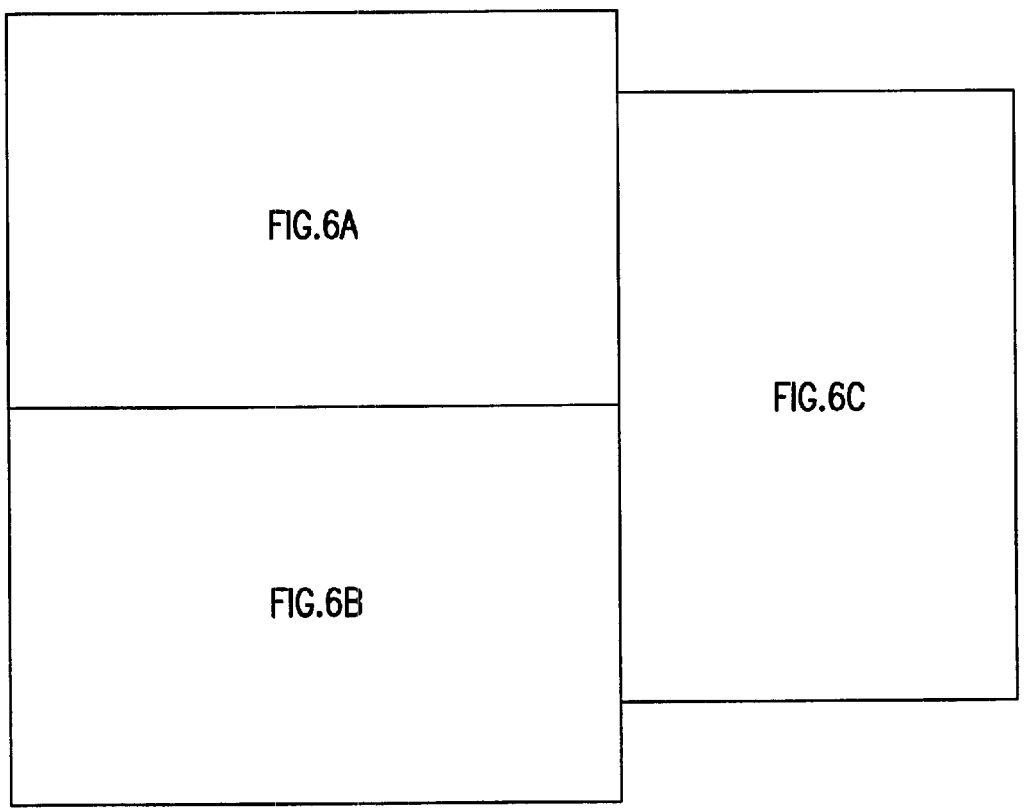
Figure 6A:
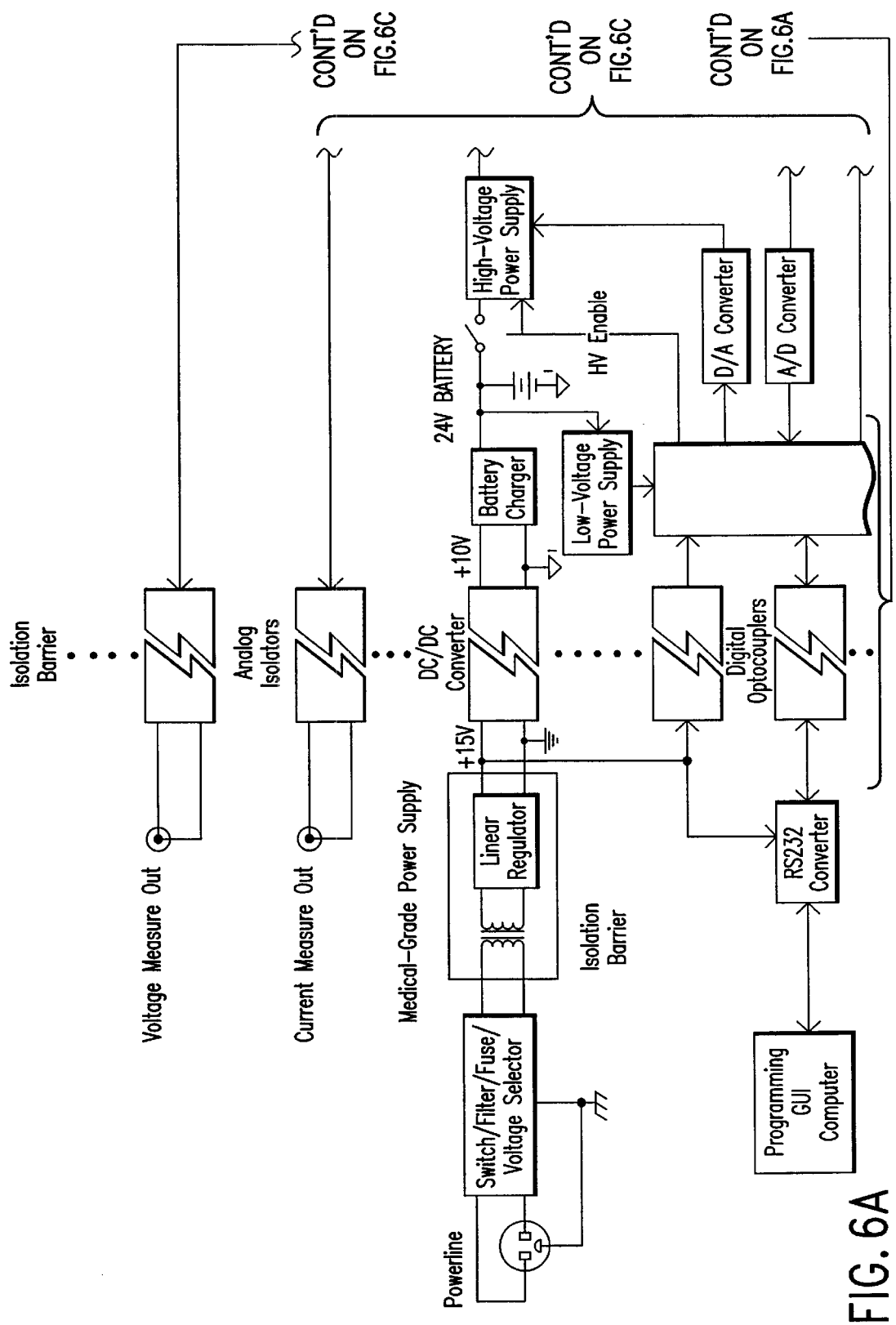
Figure 6B:
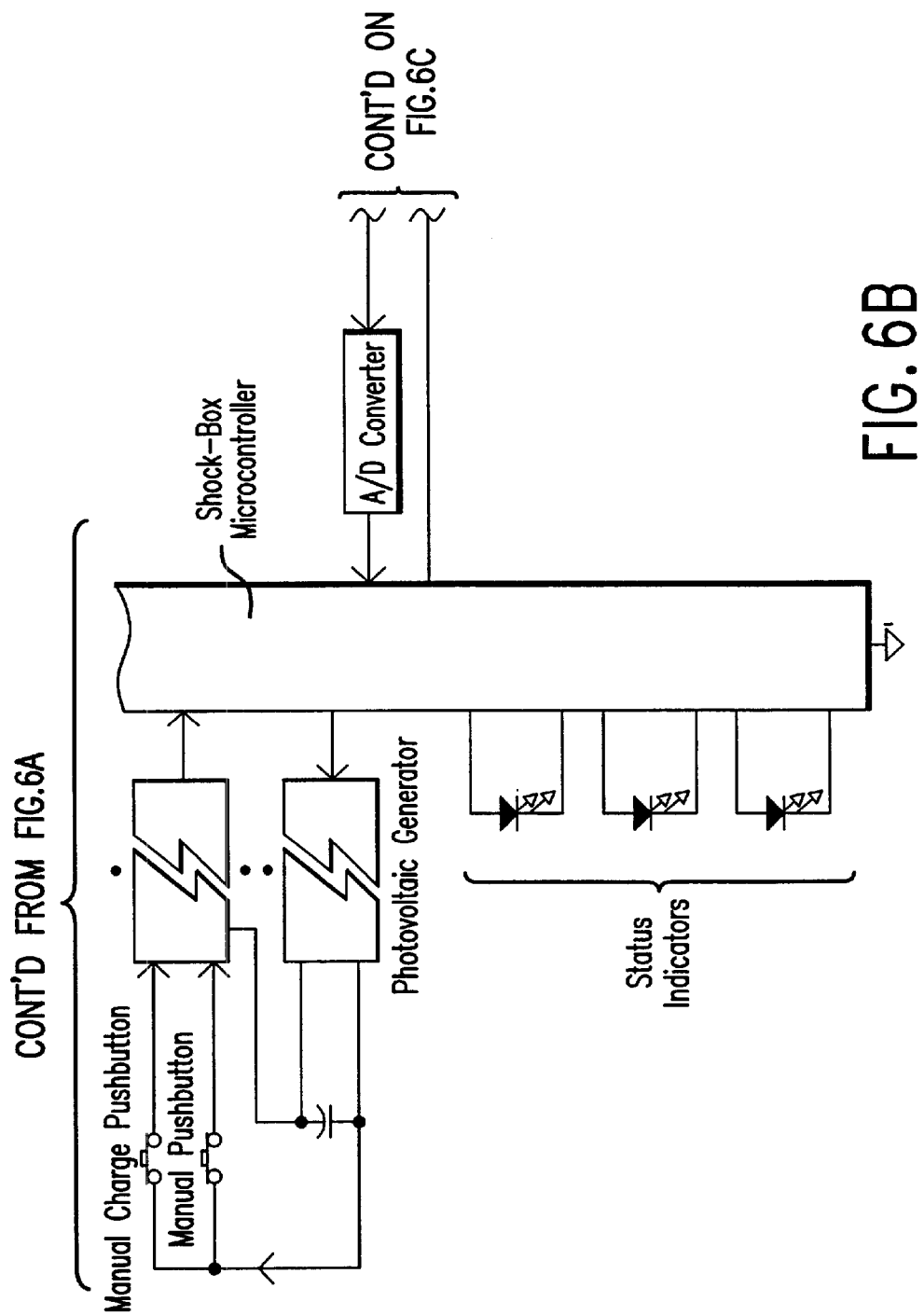
Figure 6C:
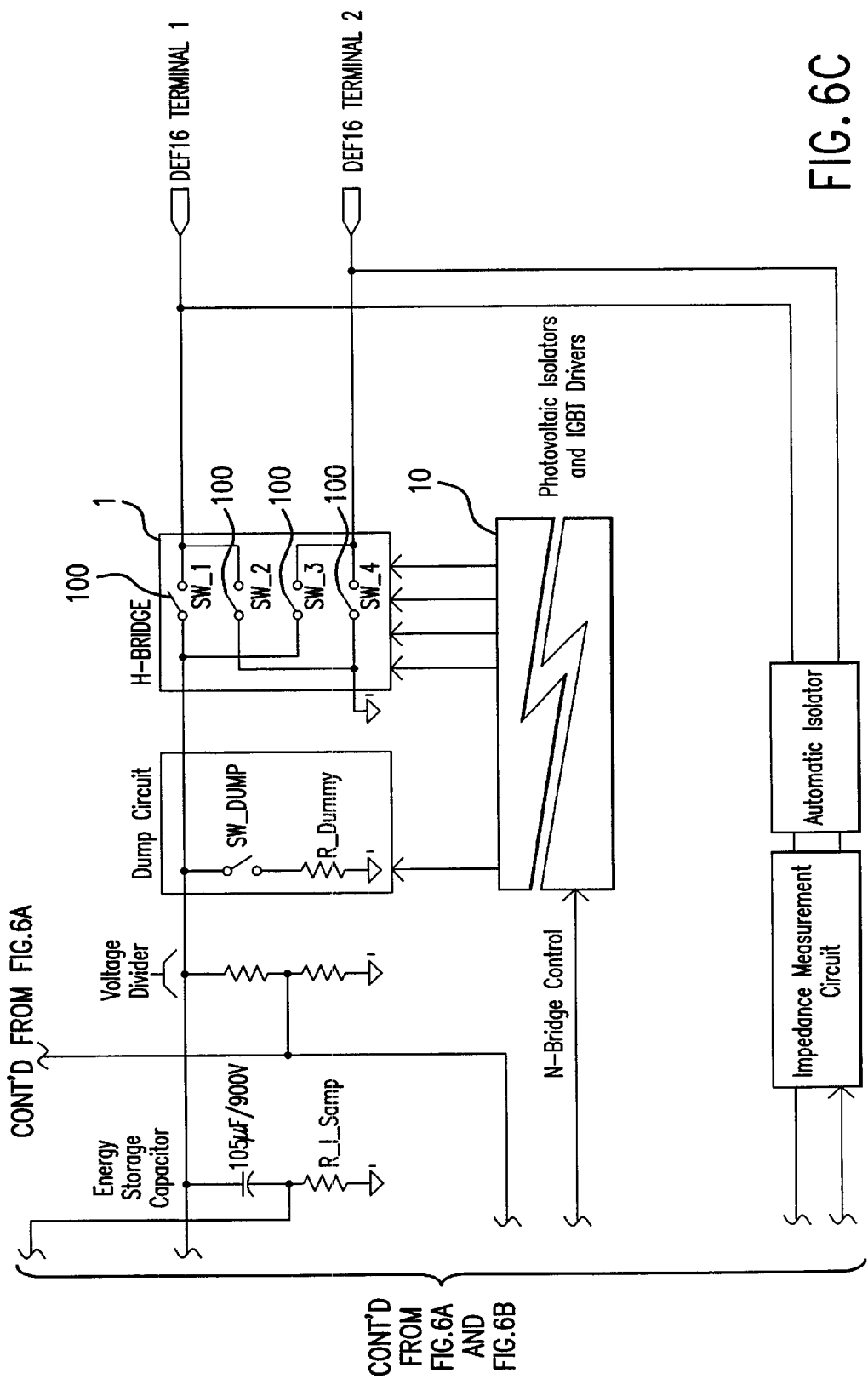

Referring now to FIG. 6, there is shown a schematic diagram illustrating relay system 10 incorporated in exemplary manner into a defibrillation system. The specific features of the given defibrillation system are not important to the present invention and are, therefore, not described in detail herein.

As a point of clarification, however, the block indicated in the Figure as relay system 10 would actually include in the application shown at least four relay systems 10, one for controlling each switch unit 100 within H-bridge 1. Switch units 100, of course, actually form a portion of relay system 10, though they are shown for clarity disposed external to the block marked as such.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, and certain features may be used independently of other features, all without departing from the spirit or scope of the invention as defined in the appended claims.

What is claimed is:

1. An electro-optically driven relay system comprising:
   (a) a switch unit for selectively coupling an energy source to a load responsive to a control signal;
   (b) an electro-optic current generating unit connected to said switch unit for generating said control signal responsive to an actuation signal;
   (c) a primary drive unit connected to said electro-optic current generating unit for selectively generating said actuation signal responsive to a first input signal; and,
   (d) at least one supplemental drive unit connected to said electro-optic current generator, said supplemental drive unit being operable responsive to a second input signal to augment said actuation signal for at least a predetermined non-zero duration;
   whereby the switching response of said switch unit is accelerated.

2. The relay system as recited in claim 1 wherein said supplemental drive unit and said primary drive unit are respectively disposed in current paths connected in parallel.

3. The relay system as recited in claim 2 wherein said electro-optic current generating unit includes at least one photovoltaic isolator device.

4. The relay system as recited in claim 3 wherein said electro-optic current generating unit includes a plurality of photovoltaic isolator devices connected one to the other in parallel.

5. The relay system as recited in claim 3 wherein said supplemental drive unit is operable to augment said actuation signal to maintain at least a predetermined current amplitude over at least said predetermined non-zero duration.

6. The relay system as recited in claim 5 wherein said actuation signal includes a base component and a supplemental component, the peak magnitude of said supplemental component being said predetermined current amplitude.

7. The relay system as recited in claim 6 wherein said actuation signal is maintained substantially at said predetermined current amplitude over said predetermined non-zero duration.

8. The relay system as recited in claim 7 wherein said predetermined current amplitude exceeds the amplitude of said base component in accordance with a ratio of approximately 8:1, and said predetermined non-zero duration equals approximately 100 $\mu$s.

9. The relay system as recited in claim 7 further comprising a conversion circuit for deriving said second input signal from said first input signal.

10. The relay system as recited in claim 7 wherein each of said primary and supplemental drive units includes a field effect transistor device, and said switch unit includes at least one insulated gate bipolar transistor.

11. The relay system as recited in claim 7 wherein said supplemental drive unit is selectively operable to offset in time said predetermined non-zero duration relative to the initial generation of said actuation signal by said primary drive unit.

12. The relay system as recited in claim 8 wherein said system maintains said response time of said drive switch unit below approximately 25 microseconds.

13. An electro-optically driven relay system comprising:
   (a) a switch unit for switching the delivery of energy to a load responsive to a control signal;
   (b) an electro-optic current generating unit connected to said switch unit for generating said control signal responsive to an actuation signal;
   (c) a primary drive unit connected to said electro-optic current generating unit for selectively generating a base component of said actuation signal, said primary drive unit being disposed within a first circuit path; and,
   (d) at least one supplemental drive unit disposed within a second circuit path connected in parallel to said first circuit path, said primary drive unit being adapted to selectively generate a supplemental component of said actuation signal, said supplemental component augmenting said base component of said actuation signal in amplitude for at least a predetermined duration;
   whereby the switching response of said switch unit is maintained below a predetermined maximum response time.

14. The relay system as recited in claim 13 wherein said supplemental drive unit is operable to maintain said supplemental component of said actuation signal at a predetermined current amplitude substantially over said predetermined duration.

15. The relay system as recited in claim 14 wherein said electro-optic current generating unit includes at least one photovoltaic isolator device.

16. The relay system as recited in claim 15 wherein said electro-optic current generating unit includes a plurality of said photovoltaic isolator devices connected one to the other in parallel.

17. The relay system as recited in claim 16 wherein said supplemental component of said actuation signal exceeds in amplitude said base component thereof in accordance with a ratio of approximately 8:1, and said predetermined duration equals approximately 100 $\mu$s.

18. The relay system as recited in claim 15 further comprising a conversion circuit for deriving a control signal for said supplemental drive unit from a control signal for said primary drive unit.

19. The relay system as recited in claim 17 wherein each of said primary and supplemental drive units includes a field effect transistor device, and said switch unit includes at least one insulated gate bipolar transistor.

20. The relay system as recited in claim 19 wherein said base and supplementary components of said actuation signal are adjustably disposed in time one relative to the other.

21. The relay system as recited in claim 19 wherein said predetermined maximum response time of said switch unit equals approximately 25 microseconds.

22. An electro-optically driven relay system for actuating the delivery of a defibrillation pulse:
   (a) a switch unit for selectively switching in conduction state responsive to a control signal;
   (b) at least one photovoltaic isolator coupled to said switch unit for generating said control signal responsive to an actuation signal;
   (c) a primary drive unit connected to said photovoltaic isolator for selectively generating said actuation signal, said primary drive unit being disposed within a first circuit path; and,
   (d) at least one supplemental drive unit disposed within a second circuit path connected in parallel to said first circuit path, said drive unit being operable to augment said actuation signal to at least a predetermined current amplitude for at least a predetermined duration;
   whereby the switching response of said switch unit is accelerated to a maximum response time of approximately 25 microseconds.

23. The relay system as recited in claim 22 wherein said electro-optic current generating unit includes a plurality of said photovoltaic isolator devices connected one to the other in parallel, each said photovoltaic isolator device including a light emitting diode.

24. The relay system as recited in claim 23 wherein said predetermined current amplitude through each said light emitting diode equals approximately 300 mA, and said predetermined duration equals approximately 100 $\mu$s.

25. The relay system as recited in claim 24 further comprising a conversion circuit for deriving a control signal for said supplemental drive unit from a control signal for said primary drive unit.

26. The relay system as recited in claim 24 wherein said primary and supplemental drive units each include a field effect transistor device, and said switch unit includes at least one insulated gate bipolar transistor.

27. The relay system as recited in claim 26 wherein said system forms at least a portion of a defibrillator H-bridge.

* * * * *